(12) United States Patent
Hong et al.

(10) Patent No.: US 7,875,488 B2
(45) Date of Patent: Jan. 25, 2011

(54) METHOD OF FABRICATING IMAGE SENSOR HAVING INNER LENS

(75) Inventors: Jong-Wook Hong, Seoul (KR); Tae-Seok Oh, Seoul (KR); Duk-Min Yi, Yongin-si (KR); Young-Mook Oh, Gyeonggi-do (KR); Won-Je Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 601 days.

(21) Appl. No.: 11/882,155

(22) Filed: Jul. 31, 2007

(65) Prior Publication Data

US 2008/0081396 A1 Apr. 3, 2008

(30) Foreign Application Priority Data

Jul. 31, 2006 (KR) ...................... 10-2006-0072203

(51) Int. Cl.
*H01L 21/00* (2006.01)
*H01L 31/062* (2006.01)
*H01L 31/113* (2006.01)

(52) U.S. Cl. .......................... 438/71; 438/70; 257/294; 257/E33.068

(58) Field of Classification Search .................. 257/294; 438/70, 71
See application file for complete search history.

(56) References Cited

U.S. PATENT DOCUMENTS 7,084,056 B2 * 8/2006 Won ............................ 438/627
7,544,982 B2 * 6/2009 Yu et al. ...................... 257/294
7,736,939 B2 * 6/2010 Wu et al. ...................... 438/71
2006/0151818 A1 * 7/2006 Toumiya ...................... 257/294

FOREIGN PATENT DOCUMENTS

| JP | 2005-086083 | 3/2005 |
|---|---|---|
| JP | 2005-294749 | 10/2005 |
| JP | 2006-086320 | 3/2006 |
| JP | 2006-093456 | 4/2006 |
| JP | 2006-196626 | 7/2006 |
| KR | 10-2005-0105586 | 11/2005 |
| KR | 10-2005-0106930 A | 11/2005 |
| KR | 10-2006-0077608 A | 7/2006 |

* cited by examiner

*Primary Examiner*—Matthew C Landau
*Assistant Examiner*—Daniel Luke
(74) *Attorney, Agent, or Firm*—Harness, Dickey & Pierce, P.L.C.

(57) ABSTRACT

A method of fabricating an image sensor according to example embodiments may include forming a photodiode in a photoelectric conversion region of a substrate and forming an etch stop layer on the substrate. The etch stop layer may be patterned to form an inner lens on the photoelectric conversion region and an etch stop layer pattern on a transistor region of the substrate. A metal interconnection structure may be formed on the inner lens and the etch stop layer pattern. Accordingly, the number of additional processes for fabricating an image sensor may be reduced.

17 Claims, 11 Drawing Sheets

METHOD OF FABRICATING IMAGE SENSOR HAVING INNER LENS

PRIORITY STATEMENT

This U.S. non-provisional patent application claims priority under 35 U.S.C. §119 to Korean Patent Application No. 10-2006-0072203, filed on Jul. 31, 2006 in the Korean Intellectual Property Office (KIPO), the entire contents of which are incorporated herein by reference.

BACKGROUND

Example embodiments relate to a method of fabricating an image sensor. Example embodiments also relate to a method of fabricating a complementary metal-oxide-semiconductor (CMOS) image sensor having an inner lens. An image sensor may convert an optical image into an electrical signal. With the development of the computer and communication industries, the demand for an improved image sensor has been increasing in various fields, e.g., digital cameras, camcorders, personal communication systems (PCS), game machines, surveillance cameras, and/or medical microcameras.

CMOS image sensors may be easier to operate and may be realized using various scanning methods. Also, CMOS image sensors may be beneficial with regard to the fabrication of smaller-sized products by allowing signal processing circuits to be integrated onto a single chip, thus reducing fabrication costs. In addition, because CMOS image sensors may require lower power consumption, they may be beneficial to products having lower battery capacity. As a result, the use of CMOS image sensors has been increasing with the realization of megapixel resolution. However, as the pixel integration degree increases (e.g., from about 1 M to about 2 M and/or 5 M), photodiode area per unit pixel may decrease. To increase the concentration of light onto the decreased photodiode area, research regarding the use of an inner lens has been actively conducted.

An inner lens may further concentrate light that has already been concentrated by a microlens such that oblique light may be reduced and more light may reach a photodiode. A conventional method may require additional processes for forming an inner lens. These additional processes may complicate the overall manufacturing process, thus increasing fabrication costs. Conventionally, an inner lens molding layer may need to be deposited and patterned to form an inner lens mold prior to actually forming the inner lens in the mold. For example, a copper interconnection may provide improved performance (compared to an aluminum interconnection, for instance) when used in an image sensor, but the fabrication process may also be more complicated. Accordingly, the additional processes used in a conventional method for forming an inner lens may not be desirable because of increased fabrication costs.

SUMMARY

Example embodiments relate to methods of fabricating an image sensor having an inner lens where the number of additional fabrication processes may be reduced. Methods of fabricating an image sensor according to example embodiments may include forming an etch stop layer on a substrate having a photoelectric conversion region and a transistor region, patterning the etch stop layer to form an inner lens having a convex upper surface on the photoelectric conversion region and an etch stop layer pattern on the transistor region, and/or forming an interconnection structure on the inner lens and the etch stop layer pattern.

Methods of fabricating an image sensor according to example embodiments may also include forming an etch stop layer on a substrate having a photoelectric conversion region and a transistor region, forming a photoresist pattern having a convex surface on the etch stop layer, etching the photoresist pattern and the etch stop layer to form an inner lens having a convex upper surface on the photoelectric conversion region and an etch stop layer pattern on the transistor region, forming an intermetal dielectric layer on the inner lens and the etch stop layer pattern, patterning the intermetal dielectric layer and the etch stop layer pattern to form a trench in the transistor region, and/or forming an interconnection in the trench. Methods of fabricating an image sensor having inner lens according to example embodiments may reduce the number of additional fabrication processes, thereby improving efficiency and reducing fabrication costs.

Figure 1A:
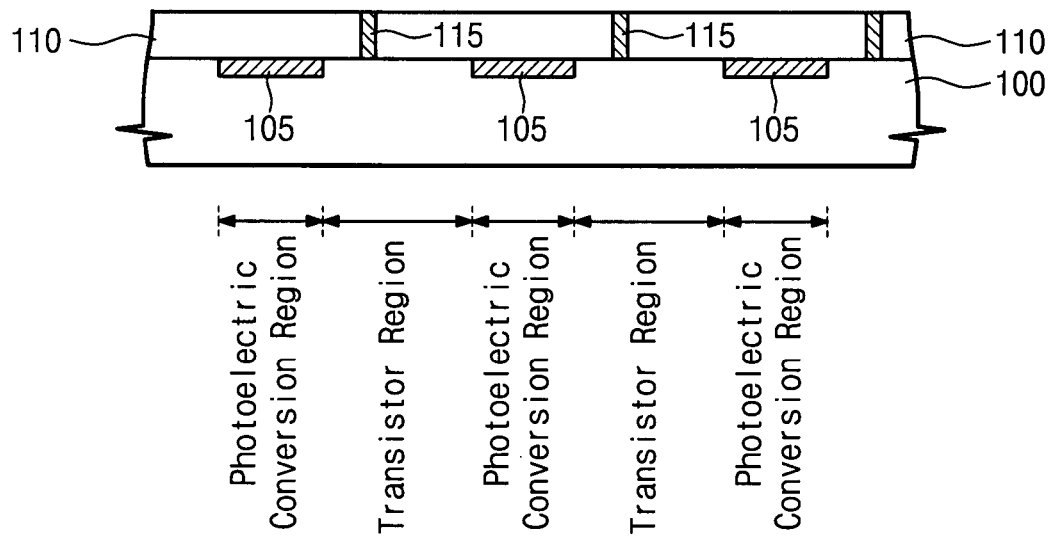
FIGS. 1A-1J are sectional views illustrating a method of fabricating an image sensor according to example embodiments.

It should be noted that the figures are intended to illustrate the general characteristics of methods, structures, and/or materials utilized in example embodiments and to supplement the written description provided below. The figures may not, however, have been drawn to scale and may not reflect the precise structural or performance characteristics of example embodiments, and should not be interpreted as defining or limiting the range of values or properties encompassed by example embodiments. For example, the relative thicknesses and positioning of molecules, layers, regions, and/or structural elements may have been reduced or exaggerated for clarity. The use of similar or identical reference numbers in the figures is intended to indicate the presence of similar or identical elements or features.

DETAILED DESCRIPTION OF EXAMPLE EMBODIMENTS

Example embodiments may be described below in more detail with reference to the accompanying drawings. Example embodiments may, however, be embodied in different forms and should not be constructed as limited to the embodiments set forth herein.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A-1J are sectional views illustrating a method of fabricating an image sensor according to example embodiments. Referring to FIG. 1A, a substrate 100, which may include a photoelectric conversion region and a transistor region, may be prepared. The photoelectric conversion region may be a region of the substrate 100 where a light-receiving element may be formed, and the transistor region may be a region in an active pixel array unit not having the light-receiving element. For example, the transistor region may include an active region or a transistor, e.g., a transfer transistor and a reset transistor. The transistor region may also include a peripheral circuit unit where an analog or digital circuit, e.g., a correlated double sampling (CDS) circuit, an image signal processor (ISP), and/or an analog to digital converter (ADC), may be formed. Alternatively, the transistor region may include both a pixel array unit (not having a light-receiving element) and a peripheral circuit unit.

A photodiode 105 may be formed in the photoelectric conversion region of the substrate 100. The photodiode 105 may be a light-receiving element that generates charges in proportion to the incident external light received and may be replaced with another device, e.g., a photogate, having the same or similar function. For example, the photodiode 105 may include an n-type photodiode and/or a p-type photodiode formed on a surface of the substrate 100. The n-type photodiode may generate electrons in proportion to the external light received, and the p-type photodiode may remove dark current generated in response to surface defects of the substrate 100. A device isolation layer (not shown) for isolating devices, a deep well (not shown), and/or source/drain regions (not shown) may also be formed in the substrate 100.

Various transistors, including a gate (not shown) and a spacer (not shown), may be formed in the transistor region of the substrate 100. For example, transistors, e.g., a transfer transistor, a reset transistor, a drive transistor, and/or a select transistor, may be formed in an active pixel array unit. Also, an n-type and/or p-type transistor may be formed in a peripheral circuit unit.

An interlayer insulating layer 110 may be formed on the substrate 100. The interlayer insulating layer 110 may be a single layer or a multilayer. A contact plug 115 may be formed in the interlayer insulating layer 110. The contact plug 115 may connect an interconnection with a lower conductor, wherein the lower conductor may be the substrate 100 or a gate (not shown). Other structures, e.g., a capacitor, may also be formed in the interlayer insulating layer 110.

Figure 1B:
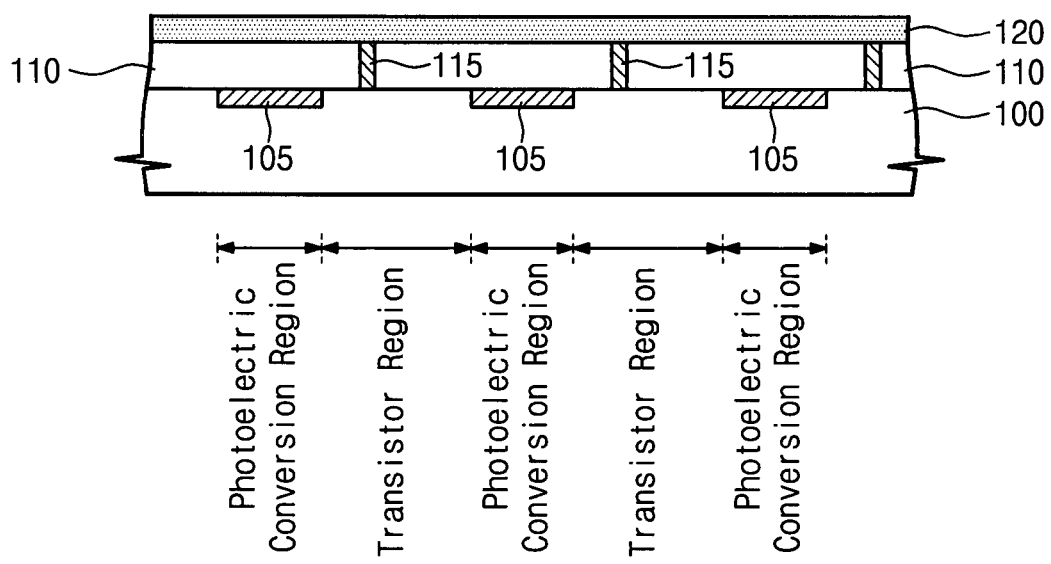

Referring to FIG. 1B, an etch stop layer 120 may be formed on the interlayer insulating layer 110. For example, the etch stop layer 120 may be a silicon nitride (SiN) layer, a silicon carbide (SiC) layer, or a silicon carbide nitride (SiCN) layer. The etch stop layer 120 may be formed of a material selected by taking into account both the function of the etch stop layer 120 in forming a suitable mold for an interconnection and in providing a suitable refractive index for a subsequently formed inner lens. For example, the etch stop layer 120 may be formed to a thickness ranging from about 1,000 Å to about 3,000 Å. The thickness of the etch stop layer 120 may be determined by taking into account the desired curvature of a subsequently formed inner lens.

Figure 1C:
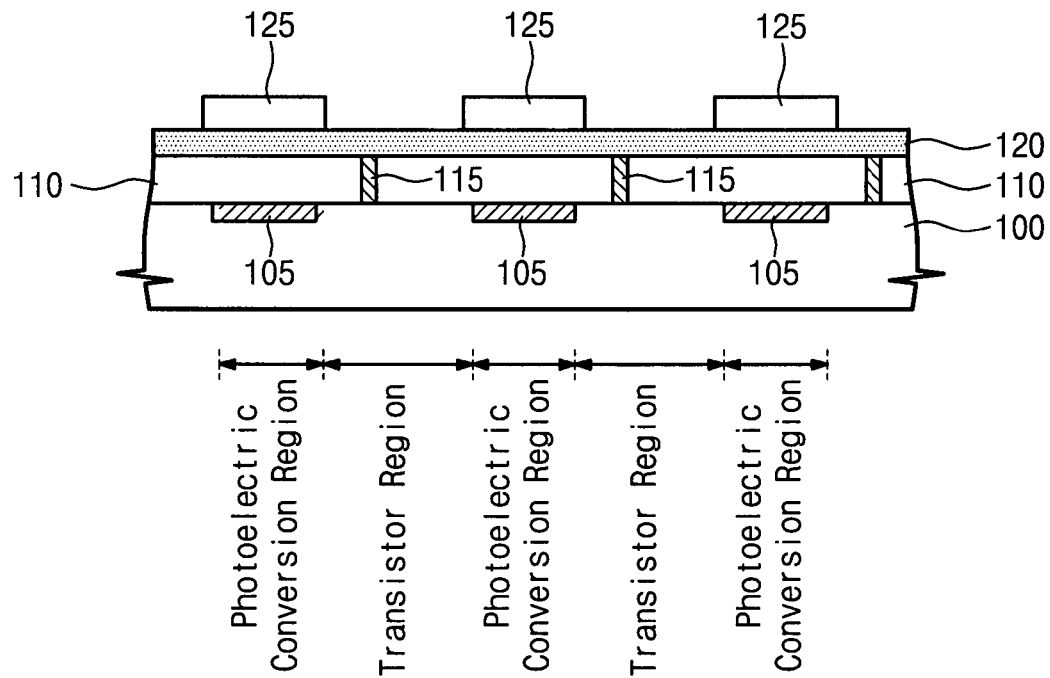

Referring to FIG. 1C, a photoresist pattern 125 may be formed on the etch stop layer 120. The photoresist pattern 125 may be used to form an inner lens. For example, the photoresist pattern 125 may be formed on the etch stop layer 120 corresponding to the photoelectric conversion region. Because the inner lens does not have to be formed in the transistor region, the photoresist pattern 125 may not be formed in the transistor region.

Figure 1D:
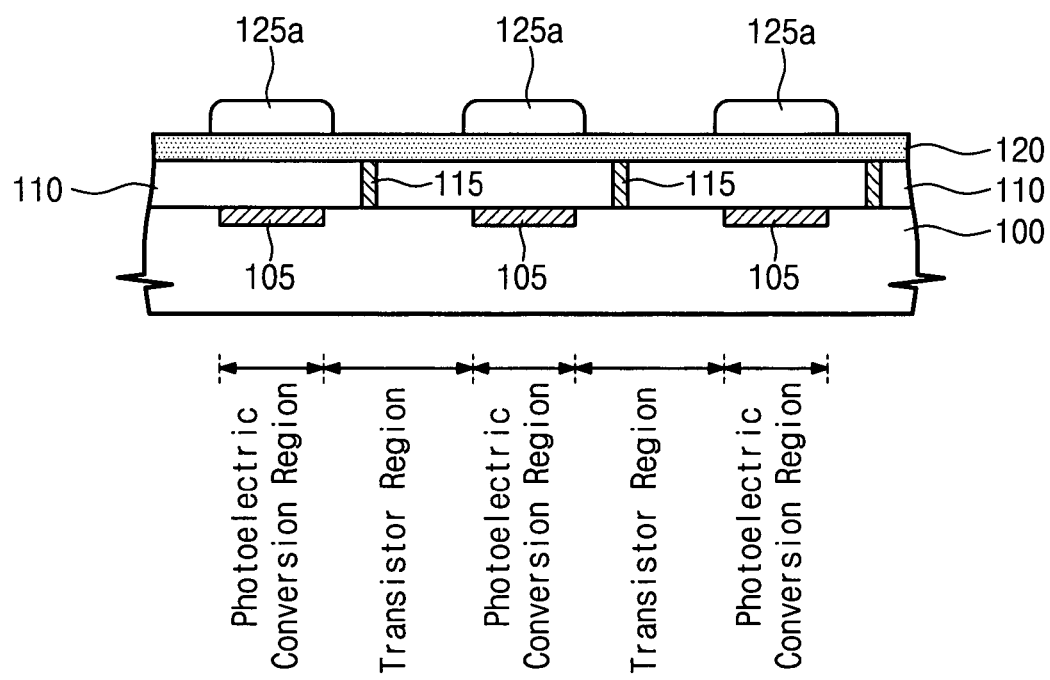

Referring to FIG. 1D, the photoresist pattern 125 may be transformed into an inner lens-shaped photoresist pattern 125a by a heat treatment. For example, the inner lens-shaped photoresist pattern 125a may have an upper surface (e.g., a surface closer to the incident light) with a convex shape. The heat treatment may be performed, for example, at about 200° C. or lower.

Figure 1E:
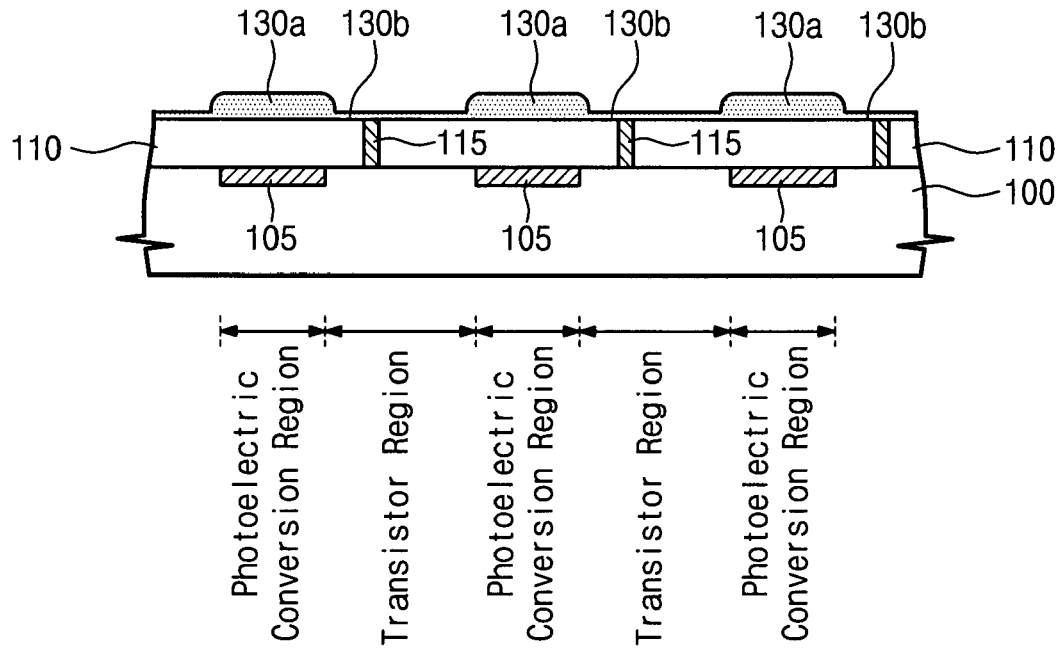

Referring to FIG. 1E, the inner lens-shaped photoresist pattern 125a and the etch stop layer 120 may be simultaneously etched, for example, with an etch-back process to thereby form an inner lens 130a on the photoelectric conversion region and an etch stop layer pattern 130b on the transistor region. By using the etch-back process, the surface profile of the inner lens-shaped photoresist pattern 125a may be transferred onto the etch stop layer 120 to form the inner lens 130a on the photoelectric conversion region. The etch-back process may be performed such that the etch stop layer 120 may still remain on the transistor region after forming the inner lens 130a so as to also form the etch stop layer pattern 130b on the transistor region. Alternatively, the etch stop layer 120 may be removed from the transistor region during the etch-back process. An additional layer deposition process may be performed to form an etch stop layer pattern, which will be described with reference to FIGS. 3A-3C below.

Conventionally, an inner lens molding layer may need to be deposited and patterned to form an inner lens mold prior to actually forming the inner lens in the mold. In contrast, according to example embodiments, the inner lens 130a and the etch stop layer pattern 130b may be simultaneously formed using the etch stop layer 120, which may be beneficial when forming an interconnection, (e.g., damascene interconnection). Therefore, the fabrication process may be simplified and fabrication costs may be reduced. For example, the etch-back process may be performed so as to leave the etch stop layer 120 at a thickness of about 400 Å to about 600 Å on the transistor region so as to form the etch stop layer pattern 130b. Alternatively, the degree of etching may be adjusted so as to achieve the desired thickness.

Figure 1F:
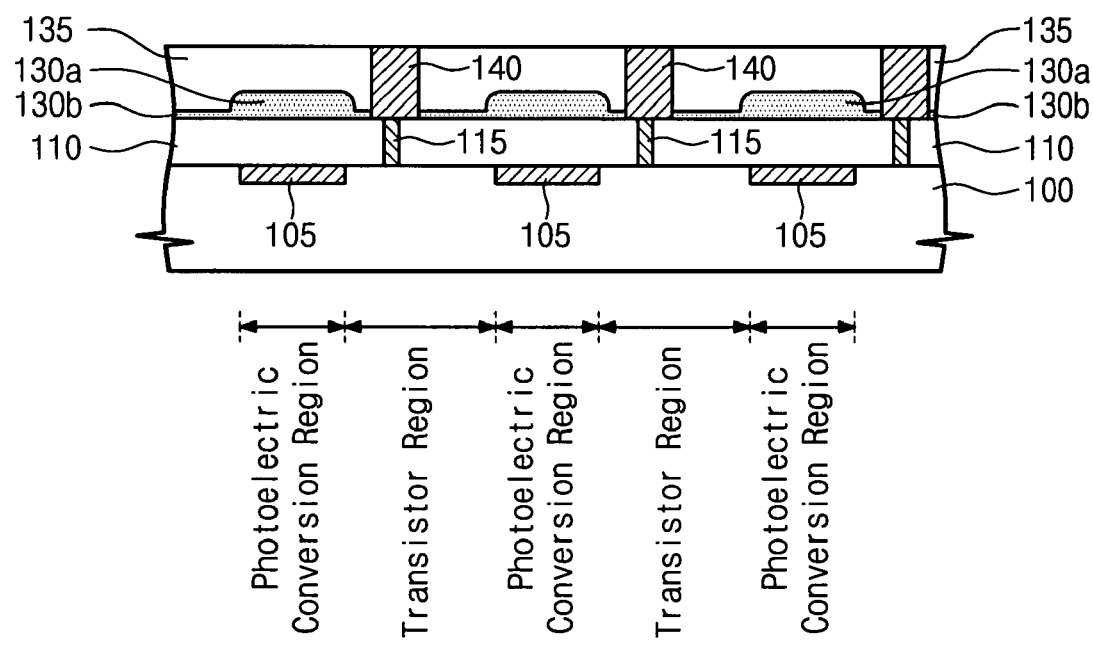

Referring to FIG. 1F, a first intermetal dielectric layer 135 may be formed on the inner lens 130a and the etch stop layer pattern 130b. For example, the first intermetal dielectric layer 135 may be a low-k insulating layer formed of fluorine-doped glass (FSG). A first interconnection 140 may be formed in the first intermetal dielectric layer 135 to achieve a metal interconnection structure, although a metal interconnection structure may include additional interconnections and/or dielectric layers. When the first interconnection 140 is formed of copper to reduce resistance, a damascene process may be used. For example, the first interlayer dielectric layer 135 may be patterned using the etch stop layer pattern 130b as an etch stop layer until the etch stop layer pattern 130b is exposed. The exposed etch stop layer pattern 130b may be etched to form an opening, e.g., a trench, which may expose a top surface of the contact plug 115. The trench may be filled with a barrier layer and copper. A planarization process, e.g., a chemical mechanical polishing (CMP) process, may be performed to form the first interconnection 140. The contact plug 115 may also be formed simultaneously with the first interconnection 140 after forming the inner lens 130a and the etch stop layer pattern 130b.

Figure 1G:
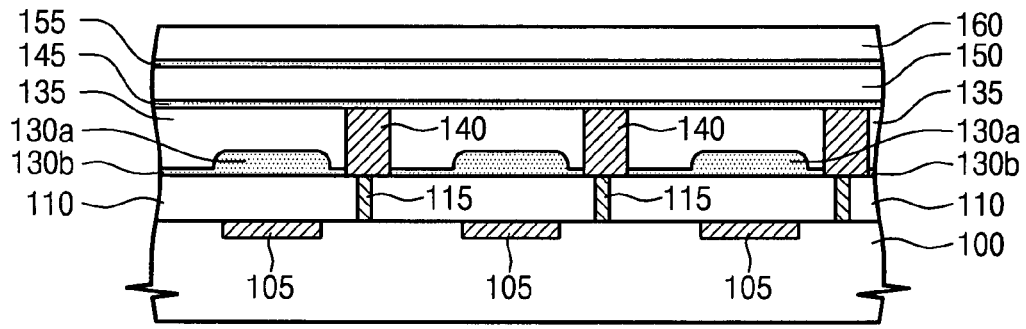

Referring to FIG. 1G, a first interconnection etch stop layer 145 may be formed on the first intermetal dielectric layer 135 and the first interconnection 140. The first interconnection etch stop layer 145 may be used as an etch stop layer and as a diffusion barrier layer for the first interconnection 140 when forming an opening (e.g., via hole 165b) to connect the first interconnection 140 with a second interconnection 165. A second intermetal dielectric layer 150, a second interconnection etch stop layer 155, and a third intermetal dielectric layer 160 may be sequentially formed on the first interconnection etch stop layer 145.

Figure 1H:
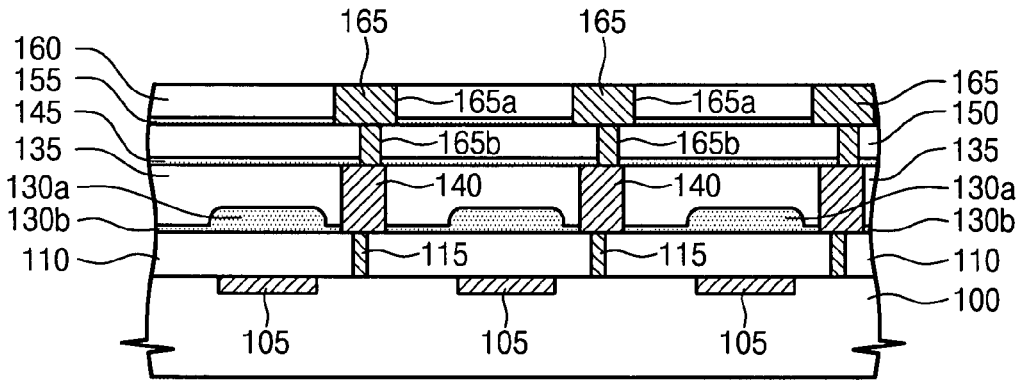

Referring to FIG. 1H, a damascene process may be performed to form the second interconnection 165 in the second and third intermetal dielectric layers 150 and 160. In the damascene process, a trench 165a and a via hole 165b may be formed, a conductive material (e.g., copper) may be filled in the trench 165a and the via hole 165b, and a CMP process may be performed on the conductive material. The via hole 165b may be formed after forming the trench 165a, or the trench 165a may be formed after forming the via hole 165b. Like the first interconnection 140, a barrier layer may be formed in the trench 165a and/or the via hole 165b before filling the trench 165a and/or the via hole 165b with copper. The first interconnection etch stop layer 145 may be used as an etch stop layer when the via hole 165b is formed, and the second interconnection etch stop layer 155 may be used as an etch stop layer when the trench 165a is formed. However, when the degree of etching may be effectively controlled, the second interconnection etch stop layer 155 may be omitted. The second interconnection 165 may be formed of copper. Alternatively, the second interconnection 165 may be formed of another suitable metal material, e.g., aluminum.

Figure 1I:
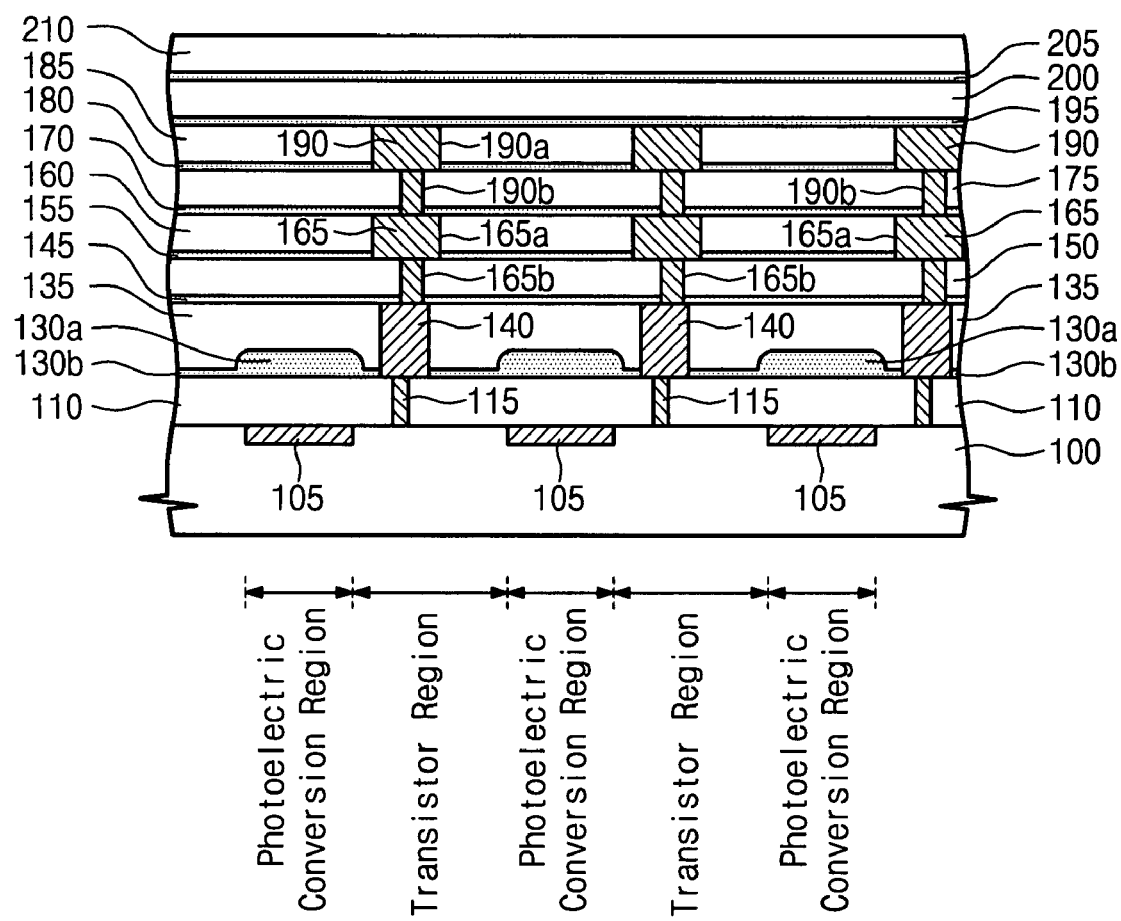

Referring to FIG. 1I, a third interconnection etch stop layer 170, a fourth intermetal dielectric layer 175, a fourth interconnection etch stop layer 180, and a fifth intermetal dielectric layer 185 may be deposited on the second interconnection 165. A damascene process may be performed to form a third interconnection 190. The process of forming the third interconnection 190 may be similar to or the same as that used to form the second interconnection 165. For example, to form the third interconnection 190, a trench 190a may be formed in the fifth intermetal dielectric layer 185 and the fourth interconnection etch stop layer 180, and a via hole 190b may be formed in the fourth intermetal dielectric layer and the third interconnection etch stop layer 170. A fifth interconnection etch stop layer 195, a sixth intermetal dielectric layer 200, a sixth interconnection etch stop layer 205, and a seventh intermetal dielectric layer 210 may be sequentially formed on the third interconnection 190. Alternatively, the fifth interconnection etch stop layer 195, the sixth intermetal dielectric layer 200, the sixth interconnection etch stop layer 205, and the seventh intermetal dielectric layer 210 may be formed to have a fourth interconnection (not shown) in a peripheral circuit unit.

In the method of fabricating an image sensor according to example embodiments, the active pixel array unit may include three interconnection layers, and the peripheral circuit unit may include four interconnection layers, but example embodiments are not limited thereto. For example, the active pixel array unit may include two interconnection layers, and the peripheral circuit unit may include three interconnection layers. Also, the active pixel array unit and the peripheral circuit unit may have the same number of interconnection layers.

Figure 1J:
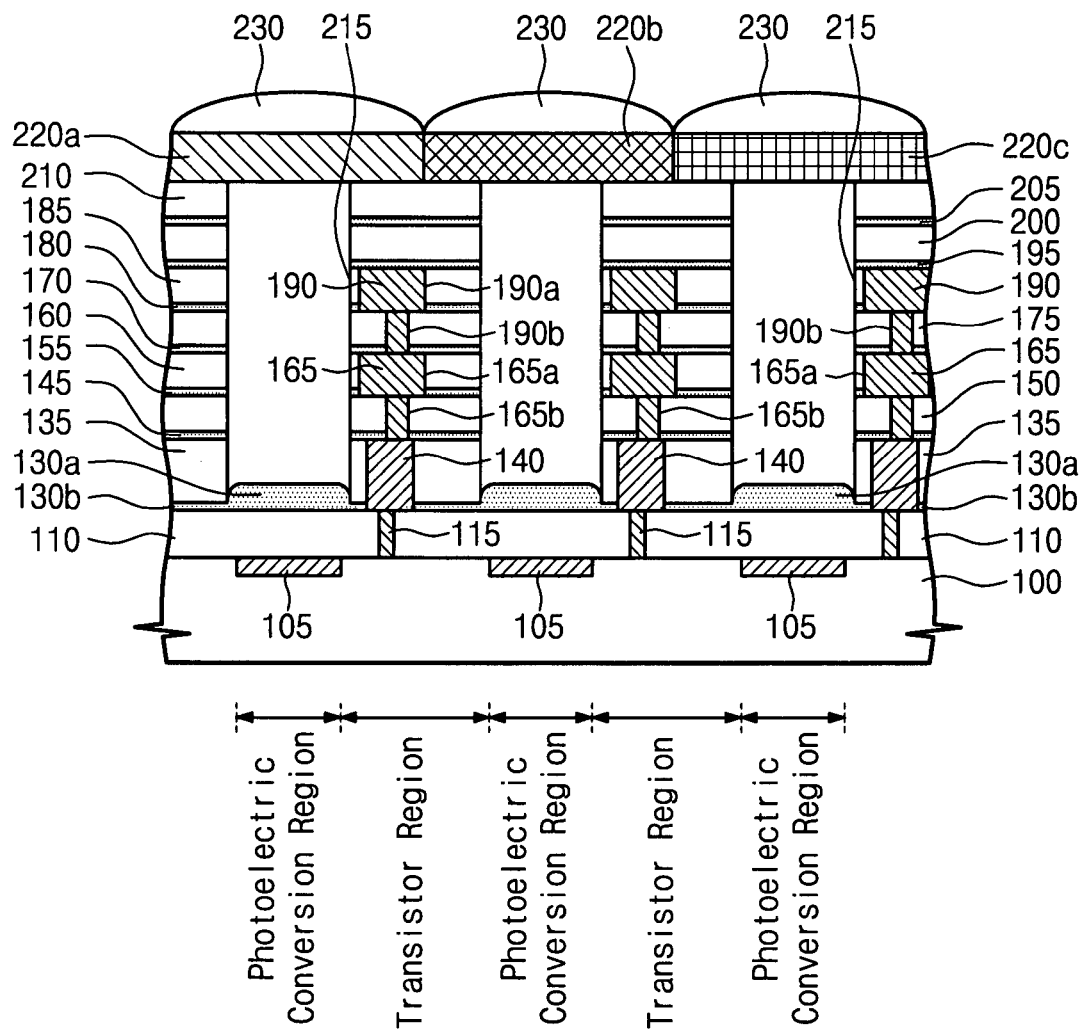

Referring to FIG. 1J, the insulating layers over the inner lens 130a (e.g., the interconnection etch stop layers 145, 155, 170, 180, 195, and 205 and the intermetal dielectric layers 135, 150, 160, 175, 185, 200, and 210) may be etched to form an opening 215 in the photoelectric conversion region. Etch stop layers may be utilized, for example, when copper is used as an interconnection material. Because the etch stop layers may have different refractive indexes from the interlayer insulating layers, the etch stop layers (e.g., silicon nitride (SiN) layers) may have reduced light transmittance. Therefore, it may be beneficial to form the opening 215 to remove the interconnection etch stop layers 145, 155, 170, 180, 195, and 205 over the inner lens 130a so as to increase light sensitivity. The opening 215 may be filled with a transparent insulating material.

Color filters 220a, 220b, and 220c may be formed over the opening 215. For example, each of the color filters 220a, 220b, and 220c may be one of red, green, and/or blue color filters. Microlenses 230 may be formed on the color filters 220a, 220b, and 220c. An over-coating layer (not shown) may also be formed between the color filters 220a, 220b, and 220c and the microlenses 230. The microlenses 230 may concentrate light together with the inner lens 130a and may be larger than the inner lens 130a.

Figure 2:
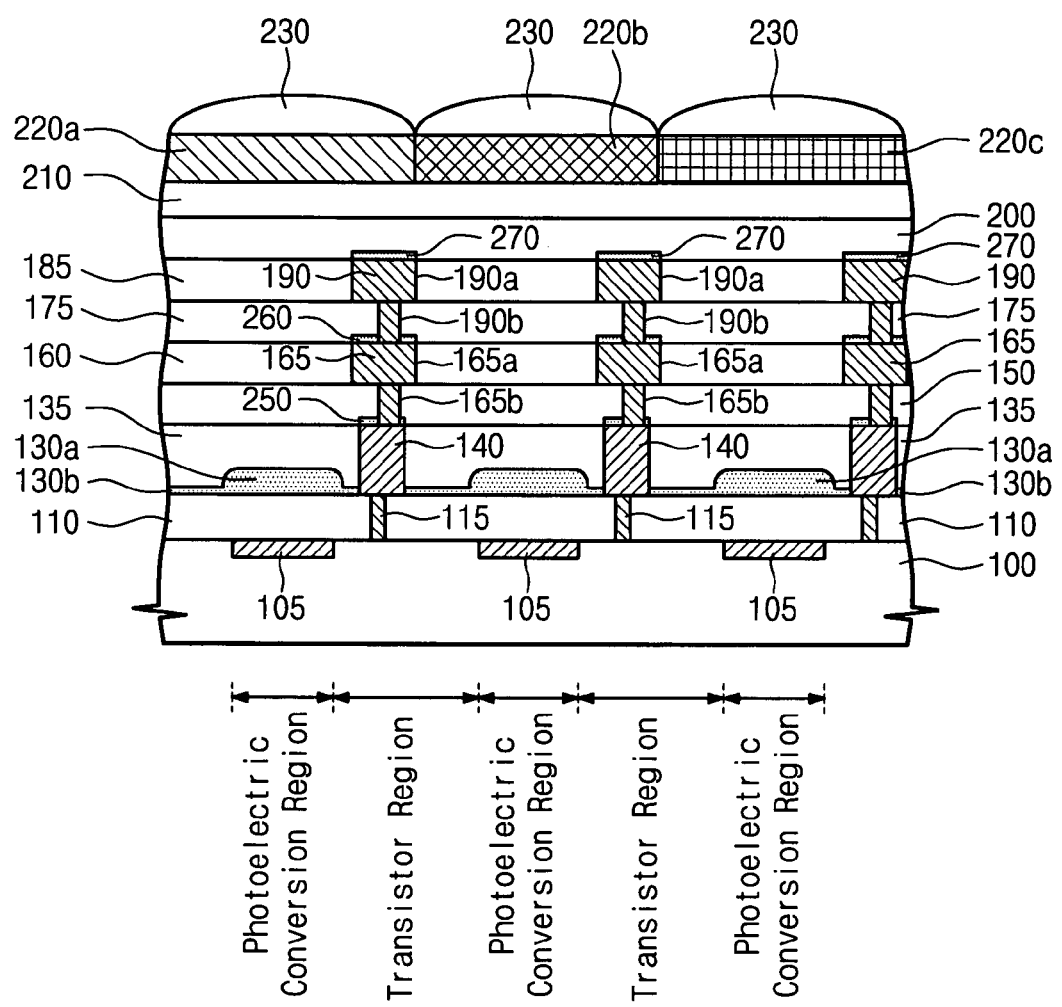
FIG. 2 is a sectional view illustrating a method of fabricating an image sensor according to example embodiments.

FIG. 2 is a sectional view illustrating a method for fabricating an image sensor according to example embodiments. The method depicted in FIG. 2 may be similar to the method depicted in FIGS. 1A-1J, except for the omission of interconnection etch stop layers, for instance. Referring to FIG. 2, optional barrier layers 250, 260, and 270 (instead of interconnection etch stop layers) may be formed on the interconnections 140, 165, and 190. Because like reference numerals refer to like elements, detailed descriptions regarding previously discussed elements may not be repeated below. Referring to FIG. 2, a first optional barrier layer 250 may be formed on the first interconnection 140 by a patterning process. Similarly, second and third optional barrier layers 260 and 270 may be formed on second and third interconnections 165 and 190, respectively, by a patterning process.

For example, when the barrier layers 250, 260, and 270 are formed of a silicon nitride (SiN), a silicon carbide (SiC), or a silicon carbide nitride (SiCN), each barrier layer may be deposited on the surface of the respective intermetal dielectric layer and patterned to form the barrier layers 250, 260, and 270 on the interconnections 140, 165, and 190. On the other hand, when the barrier layers 250, 260, and 270 are formed of a cobalt tungsten phosphor (CoWP), the barrier layers 250, 260, and 270 may be selectively deposited on the interconnections 140, 165, and 190, respectively. When the degree of etching may be effectively controlled during the formation of a trench and/or via hole for an interconnection, intermetal dielectric layers 135, 150, 160, 175, 185, 200, and/or 210 may be formed as a single layer. For example, the second and third intermetal dielectric layers 150 and 160 may be formed as a single layer.

Figure 3A:
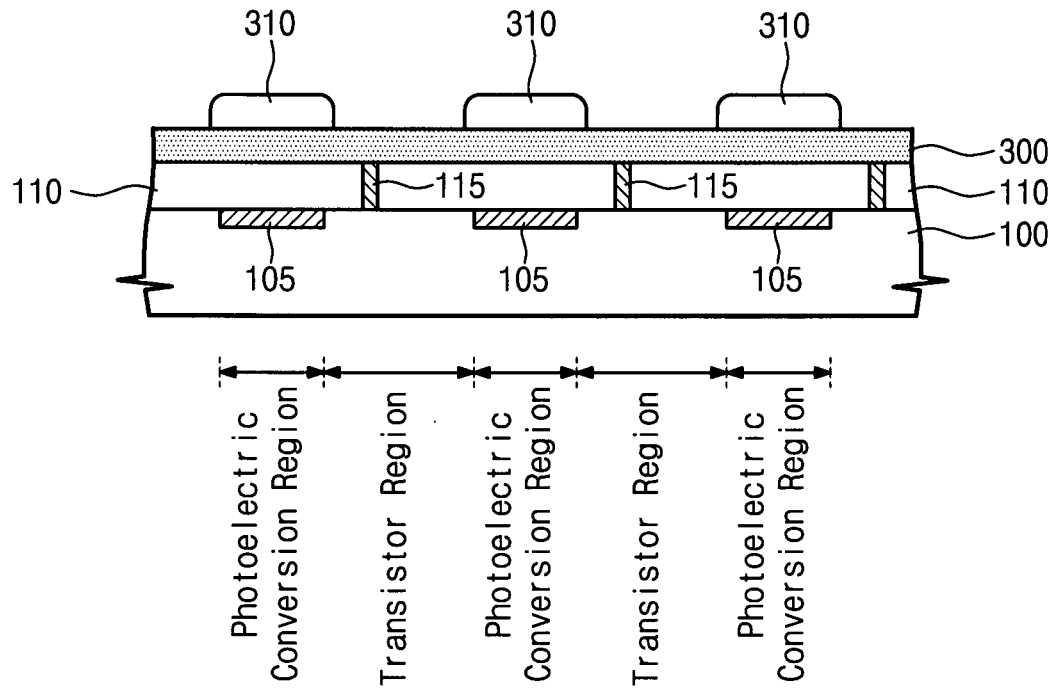
FIGS. 3A-3C are sectional views illustrating a method of fabricating an image sensor according to example embodiments.
Figure 3B:
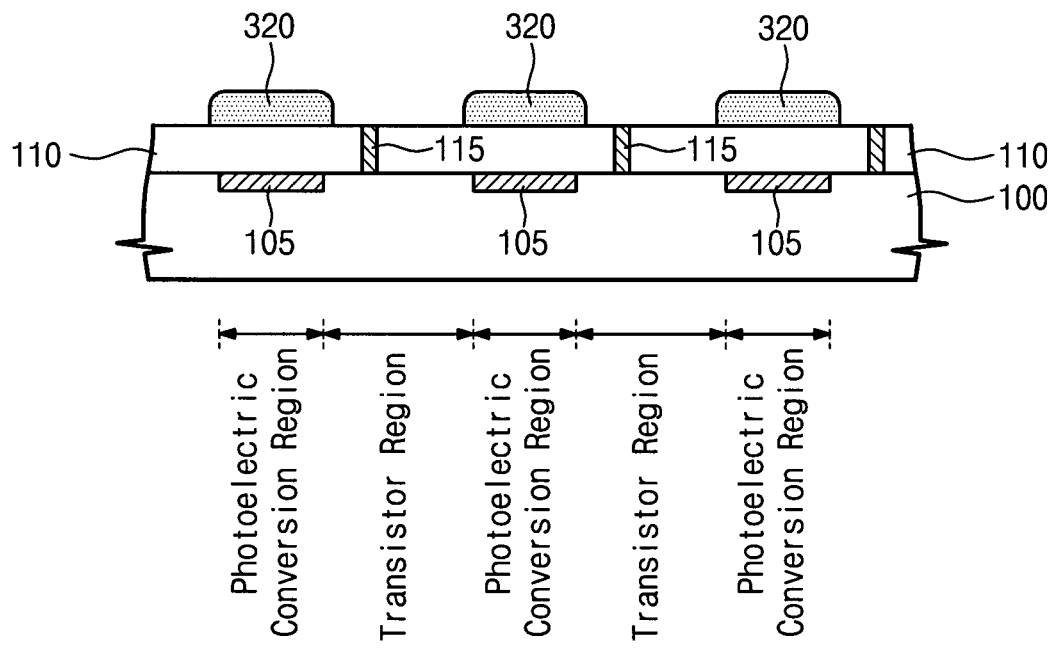
Figure 3C:
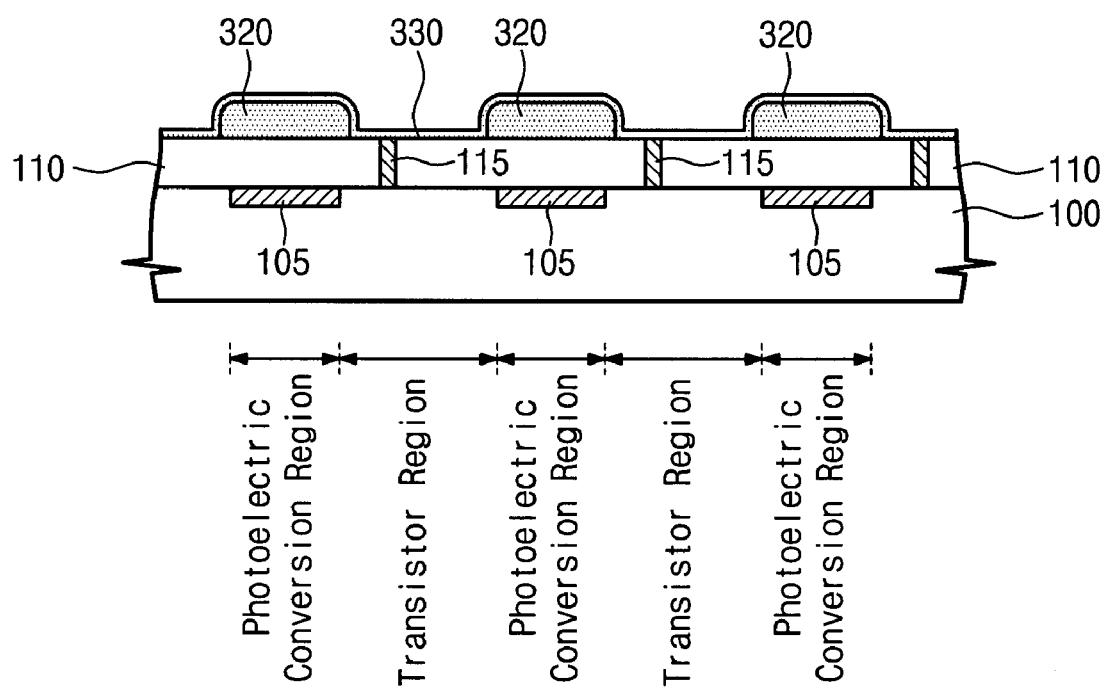

FIGS. 3A through 3C are sectional views illustrating a method for fabricating an image sensor according to example embodiments. The method depicted in FIGS. 3A-3C may be similar to the methods depicted in FIGS. 1A-1J and FIG. 2, except for the lens forming process. Because like reference numerals refer to like elements, a detailed descriptions relating to previously discussed elements may not be repeated. Referring to FIG. 3A, an inner-lens shaped photoresist pattern 310 may be formed on a first etch stop layer 300. For example, the first etch stop layer 300 may be a silicon nitride (SiN) layer, a silicon carbide (SiC) layer, or a silicon carbide nitride (SiCN) layer. A material for the first etch stop layer 300 may be selected by taking into account the desired refractive index for the subsequently formed inner lens. For example, the first etch stop layer 300 may be formed to a thickness ranging from about 1,000 Å to about 3,000 Å. The thickness of the first etch stop layer 300 may also be determined by taking into account the desired curvature for the subsequently formed inner lens. The inner-lens shaped photoresist pattern 310 may be achieved by forming a photoresist pattern (not shown) and performing a heat treatment on the photoresist pattern.

Referring to FIG. 3B, the first etch stop layer 300 may be etched to form an inner lens 320. Referring to FIG. 3C, a second etch stop layer 330 may be deposited on the inner lens 320 in the photoelectric conversion region as well as on the transistor region. Accordingly, the surface profile of the inner lens 320 may be transferred to the second etch stop layer 330 such that the second etch stop layer 330 of the photoelectric conversion region may also serve as an inner lens.

The second etch stop layer 330 of the photoelectric conversion region may reduce or prevent etch damage to the surface of the inner lens 320, thereby improving the light concentration efficiency and sensitivity. The second etch stop layer 330 may be thinner than the first etch stop layer 300. For example, the first etch stop layer 300 may have a thickness of about 1,000 Å-about 3,000 Å, and the second etch stop layer 330 may have a thickness of about 400 Å-about 600 Å. A metal interconnection structure on the second etch stop layer 330 may be a structure where interconnection etch stop layers (not shown) are interposed between intermetal dielectric layers (not shown) as depicted, for instance, in FIG. 1J. Alternatively, the metal interconnection structure may be a structure where a barrier layer (not shown) is selectively formed on each interconnection as depicted in FIG. 2.

Figure 4:
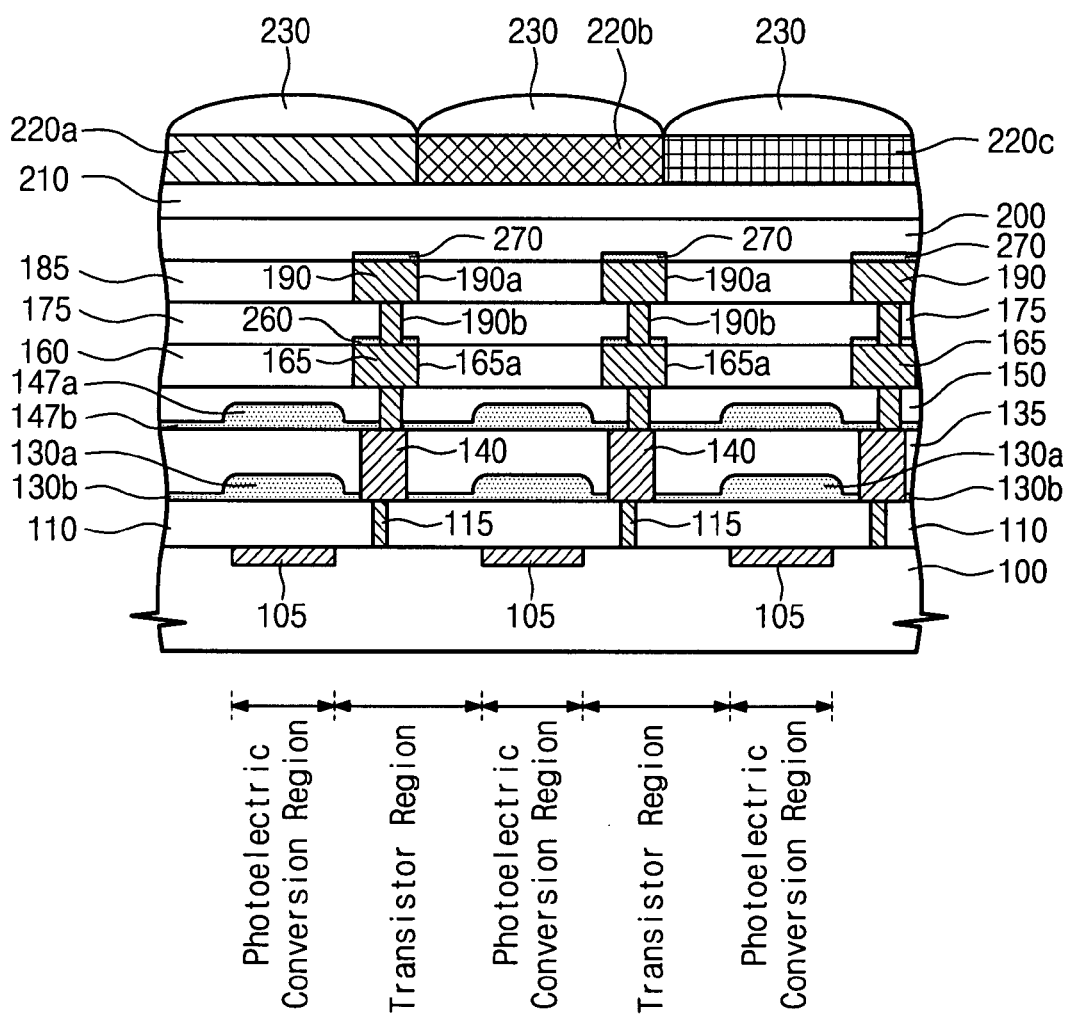
FIG. 4 is a sectional view of an image sensor having a plurality of inner lenses between a microlens and a photoelectric conversion device.
Figure 5:
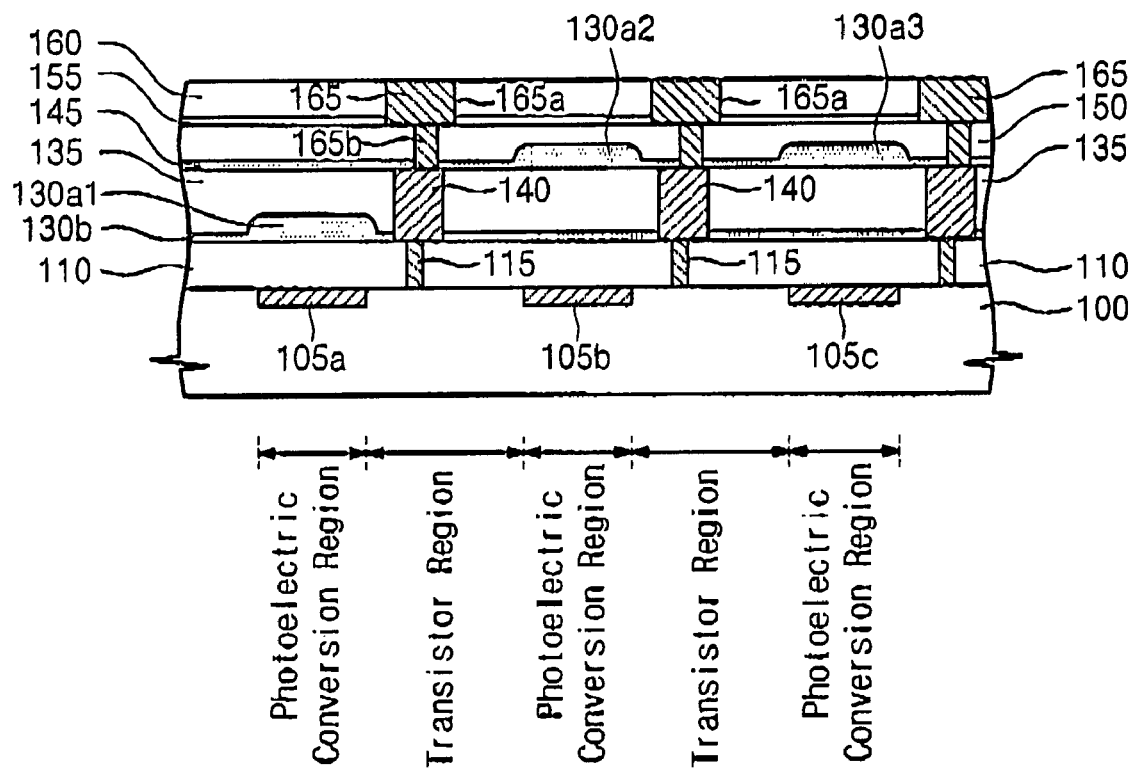
FIG. 5 is a sectional view of an image sensor having inner lenses formed on different interlayer insulating layers.

Referring to FIG. 4, a plurality of inner lenses 130a and 147a may be formed between a microlens 230 and a photoelectric conversion device (e.g., photodiode 105). Referring to FIG. 5, inner lenses 130a1, 130a2, and 130a3 may be formed in different interlayer insulating layers (e.g., at different heights). For example, an inner lens 130a1 above a light-receiving element 105a may be formed on an interlayer insulating layer 110, and inner lenses 130a2 and 130a3 above light-receiving elements 105b and 105c, respectively, may be formed on a first intermetal dielectric layer 135. The degree of light concentration may vary depending on the type of color filter, thereby enabling the realization of optimized color. Also, because the inner lenses 130a2 and 130a3 may be further etched during an etch process for forming an opening 215 (not shown here, but see FIG. 1J), the inner lenses 130a2 and 130a3 may thinner than the inner lens 130a1. Therefore, inner lenses 130a1, 130a2, and 130a3 may have different thicknesses (e.g., different radii of curvature), depending on the color filter, thus enabling the achievement of optimized color.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:
1. A method of fabricating an image sensor, comprising:
providing a substrate having first and second photoelectric conversion regions and a transistor region between the first and second photoelectric conversion regions;
forming a first etch stop layer on the substrate;
forming a first inner lens and a first etch stop layer pattern by patterning the first etch stop layer, the first inner lens being on the first photoelectric conversion region and having a convex upper surface;
forming a first interconnection structure on the first inner lens and the first etch stop layer pattern;
forming a second etch stop layer on the first interconnection structure;
forming a second inner lens and a second etch stop layer pattern by patterning the second etch stop layer, the second inner lens being on the second photoelectric conversion region and having a convex upper surface; and forming a second interconnection structure on the second inner lens and the second etch stop layer pattern, wherein a radius of curvature of the first inner lens is different from a radius of curvature of the second inner lens.

2. The method of claim 1, further comprising:
forming a microlens on at least one of the first and second interconnection structure.

3. The method of claim 1, wherein patterning at least one of the first and second etch stop layer includes:
forming a photoresist pattern on at least one of the first and second etch stop layers;
heat-treating the photoresist pattern to form an inner lens-shaped photoresist pattern; and
at least one of etching the inner lens-shaped photoresist pattern and the first etch stop layer when the photoresist pattern is formed on the first etch stop layer and etching the inner lens-shaped photoresist pattern and the second etch stop layer when the photoresist pattern is formed on the second etch stop layer.

4. The method of claim 1, wherein at least one of the first and second etch stop layers includes at least one of silicon nitride (SiN), silicon carbide (SiC), and silicon carbide nitride (SiCN), and wherein at least one interconnection of the first and second interconnection structures includes copper.

5. The method of claim 1, wherein forming at least one of the first and second interconnection structure includes:
at least one of forming an intermetal dielectric layer on the first inner lens and the first etch stop layer pattern and forming an intermetal dielectric layer on the second inner lens and the second etch stop layer pattern;
at least one of patterning the intermetal dielectric layer and the first etch stop layer pattern to form an opening when the intermetal dielectric layer is formed on the first inner lens and the first etch stop layer pattern and patterning the intermetal dielectric layer and the second etch stop layer pattern to form an opening when the intermetal dielectric layer is formed on the second inner lens and the second etch stop layer pattern; and
filling the opening with a conductive material.

6. The method of claim 1, further comprising:
stacking at least one interconnection etch stop layer and at least one intermetal dielectric layer on at least one of the first and second interconnection structure;
patterning the at least one intermetal dielectric layer and the at least one interconnection etch stop layer to form at least one of a trench and a via hole; and
filling at least one of the trench and the via hole with a conductive material.

7. The method of claim 1, further comprising:
forming a color filter on at least one of the first and second inner lens; and
forming a microlens on the color filter.

8. The method of claim 1, further comprising:
forming a barrier layer on at least one of the first and second interconnection structures;
forming an intermetal dielectric layer on the barrier layer;
patterning the intermetal dielectric layer and the barrier layer to form an opening; and
filling the opening with a conductive material.

9. The method of claim 8, wherein the barrier layer includes at least one of silicon nitride (SiN), silicon carbide nitride (SiCN), and cobalt tungsten phosphor (CoWP).

10. The method of claim 8, further comprising:
forming a color filter on at least one of the first and second interconnection structure; and
forming a microlens on the color filter.

11. The method of claim 1, wherein patterning at least one of the first and second etch stop layer includes:
forming a photoresist pattern on at least one of the first and second etch stop layer;
heat-treating the photoresist pattern to form an inner lens-shaped photoresist pattern;
at least one of etching the inner lens-shaped photoresist pattern and the first etch stop layer to form a preliminary inner lens when the photoresist pattern is formed on the first etch stop layer and etching the inner lens-shaped photoresist pattern and the second etch stop layer to form a preliminary inner lens when the photoresist pattern is formed on the second etch stop layer; and
at least one of providing a third etch stop layer on the preliminary inner lens to form an inner lens on the first photoelectric conversion region when the photoresist pattern is formed on the first etch stop layer and an etch stop layer pattern on the transistor region and providing a third etch stop layer on the preliminary inner lens to form an inner lens on the second photoelectric conversion region when the photoresist pattern is formed on the second etch stop layer and an etch stop layer pattern on the transistor region.

12. The method of claim 11, wherein the third etch stop layer is thinner than at least one of the first and second etch stop layer.

13. The method of claim 11, wherein forming at least one of the first and second interconnection structure includes:
at least one of forming an intermetal dielectric layer on the first inner lens and the first etch stop layer pattern and forming an intermetal dielectric layer on the second inner lens and the second etch stop layer pattern;
at least one of patterning the intermetal dielectric layer and the first etch stop layer pattern to form an opening when the intermetal dielectric layer is formed on the first inner lens and the first etch stop layer pattern and patterning the intermetal dielectric layer and the second etch stop layer pattern to form an opening when the intermetal dielectric layer is formed on the second inner lens and the second etch stop layer pattern; and
filling the opening with a conductive material.

14. The method of claim 13, further comprising:
stacking at least one interconnection etch stop layer and at least one intermetal dielectric layer on at least one of the first and second interconnection structure;
patterning the at least one intermetal dielectric layer and the at least one interconnection etch stop layer to form at least one of a trench and a via hole; and
filling at least one of the trench and the via hole with a conductive material.

15. The method of claim 13, further comprising:
forming a barrier layer on at least one of the first and second interconnection structure;
forming an intermetal dielectric layer on the barrier layer;
patterning the intermetal dielectric layer and the barrier layer to form an opening; and
filling the opening with a conductive material.

16. The method of claim 15, wherein the barrier layer includes at least one of silicon nitride (SiN), silicon carbide nitride (SiCN), and cobalt tungsten phosphor (CoWP).

17. The method of claim 8, wherein the conductive material comprises copper.

* * * * *